United States Patent
Yamamoto

(10) Patent No.: US 7,326,988 B2
(45) Date of Patent: Feb. 5, 2008

(54) SEMICONDUCTOR DEVICE AND METHOD FOR FABRICATING THE SAME

(75) Inventor: Kazuhiko Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 297 days.

(21) Appl. No.: 10/602,915

(22) Filed: Jun. 25, 2003

(65) Prior Publication Data
US 2004/0004242 A1 Jan. 8, 2004

(30) Foreign Application Priority Data
Jul. 2, 2002 (JP) ............................. 2002-193042

(51) Int. Cl.
*H01L 27/108* (2006.01)
*H01L 29/76* (2006.01)
(52) U.S. Cl. ................... 257/310; 257/406; 257/410
(58) Field of Classification Search ................ 257/310, 257/406, 407, 408, 409, 410; 438/216, 287, 438/585, 591, 778, 785, 786, 787, 788, 789, 438/790, 791, 792
See application file for complete search history.

(56) References Cited

U.S. PATENT DOCUMENTS

| | | | | |
|---|---|---|---|---|
| 4,605,947 | A * | 8/1986 | Price et al. ................. | 257/388 |
| 6,060,755 | A | 5/2000 | Ma et al. | |
| 6,297,539 | B1 * | 10/2001 | Ma et al. .................... | 257/410 |
| 6,448,192 | B1 * | 9/2002 | Kaushik ..................... | 438/785 |
| 6,451,647 | B1 * | 9/2002 | Yang et al. ................. | 438/240 |
| 6,559,014 | B1 * | 5/2003 | Jeon ........................... | 438/287 |
| 6,562,491 | B1 * | 5/2003 | Jeon ........................... | 428/697 |
| 6,586,349 | B1 * | 7/2003 | Jeon et al. .................. | 438/785 |
| 6,627,503 | B2 * | 9/2003 | Ma et al. .................... | 438/287 |
| 6,642,573 | B1 * | 11/2003 | Halliyal et al. ............. | 257/316 |
| 6,645,882 | B1 * | 11/2003 | Halliyal et al. ............. | 438/785 |
| 6,649,462 | B2 * | 11/2003 | Azuma et al. .............. | 438/231 |
| 6,703,277 | B1 * | 3/2004 | Paton et al. ................ | 438/287 |
| 6,709,926 | B2 * | 3/2004 | Chidambarrao et al. .... | 438/258 |
| 6,713,846 | B1 * | 3/2004 | Senzaki ...................... | 257/635 |
| 6,717,226 | B2 * | 4/2004 | Hegde et al. ............... | 257/406 |

(Continued)

FOREIGN PATENT DOCUMENTS

JP 11-168096 6/1999

(Continued)

OTHER PUBLICATIONS

Shui-Hsiang Su et al. "A Two-Step Deposition Technology for High Dielectric Constant $HfO_2$ Thin Films" *Electrochemical and Solid-State Letters*, 4(9), 2001, pp. F18-F19.

(Continued)

*Primary Examiner*—Ori Nadav
(74) *Attorney, Agent, or Firm*—McDermott Will & Emery LLP

(57) ABSTRACT

A metal film formed of a first metal having relatively high oxygen absorption properties on a silicon region, and then depositing a high dielectric constant film formed of an oxide of a second metal having relatively low oxygen absorption properties on the metal film. Thereafter, a conductive film is formed on the high dielectric constant film and then the conductive film is patterned, thereby forming an electrode.

7 Claims, 4 Drawing Sheets

U.S. PATENT DOCUMENTS 6,844,604 B2 * 1/2005 Lee et al. .................... 257/410
2001/0023120 A1 * 9/2001 Tsunashima et al. ........ 438/585

FOREIGN PATENT DOCUMENTS

| JP | 2001-267566 | 9/2001 |
| JP | 2002-043585 | 2/2002 |
| JP | 2002-057301 | 2/2002 |
| JP | 2003-023140 | 1/2003 |
| JP | 2003-188374 | 7/2003 |

OTHER PUBLICATIONS

Yamamoto et al. "Effect of Hf Metal Predeposition on the Properties of Sputtered $HfO_2$/Hf Stacked Gate Dielectrics" Applied Physics Letters 81(11), Sep. 9, 2002, pp. 2053-2055.

Byoung Hun Lee et al. "Ultrathin Hafnium Oxide With Low Leakage and Excellent Reliability for Alternative Gate Dielectric Application" IEDM, 1999, pp. 133-136.

* cited by examiner

SEMICONDUCTOR DEVICE AND METHOD FOR FABRICATING THE SAME

BACKGROUND OF THE INVENTION

The present invention relates to methods for fabricating a semiconductor device, and more particularly relates to a method for fabricating an MISFET or an MIS capacitor which includes a high dielectric gate insulating film.

When a known gate insulating film made of a silicon oxide film is formed, a silicon oxide film can be obtained by directly oxidizing a silicon wafer that is to be a substrate. In contrast, in the case of forming a high dielectric gate insulating film, a high dielectric constant film can not be obtained by simply oxidizing a silicon substrate because a metal material for a high dielectric constant film is not contained in the substrate. For this reason, methods in which a high dielectric constant film is deposited on a substrate using CVD (chemical vapor deposition), sputtering, molecular beam epitaxy, laser ablation or like techniques have been used. Particularly, if sputtering among the above-described deposition techniques is used, a high dielectric constant film with excellent electric properties can be obtained. More specifically, in a sputtering process, a single-element metal target is used as a material and therefore it is possible to prevent an impurity such as an organic substance or water from entering into a deposited film and also to densify the deposited film (see, for example, Byoung Hun Lee et al., Ultrathin Hafnium Oxide with Low Leakage and Excellent Reliability for Alternative Gate Dielectric Application, IEDM 1999, pp. 133-136), compared to the case where CVD is used.

When a high dielectric constant film (more specifically, a high dielectric metal oxide film) is deposited by sputtering, sputtering is performed using a metal target in an atmosphere containing argon and oxygen, or using a metal oxide target in an argon atmosphere. More specifically, in either case of sputtering and CVD, when the process step of depositing a metal oxide film is performed, an activated oxidation species is generated while a silicon substrate as a underlayer for deposition of a metal oxide film is oxidized by the oxidation species. If a silicon substrate is oxidized, a silicon oxide film with a low dielectric constant is formed under a metal oxide film with a high dielectric constant, resulting in reduction in the capacitance value of a capacitor structure. Therefore, in depositing of a high dielectric metal oxide film by sputtering, it is required to suppress oxidation of a silicon substrate by active oxygen or the like.

Then, as a method for suppressing oxidation of a silicon substrate, for example, there has been proposed a method in which before depositing a high dielectric metal oxide film (specifically, a hafnium oxide film), a metal film (specifically, a hafnium metal film) including the same metal as that contained in the metal oxide film is deposited (see, e.g., Byoung Hun Lee et al., Ultrathin Hafnium Oxide with Low leakage and Excellent Reliability for Alternative Gate Dielectric Application, IEDM 1999, pp. 133-136). Moreover, a method in which before depositing a high dielectric metal oxide film, a metal oxide film with a low oxygen content is deposited has been also proposed (see, e.g., Shui-Hsiang Su et al., A Two-Step Deposition Technology for High Dielectric Constant $HfO_2$ Thin Films, Electrochemical and Solid-State Letters 4(9) F18-F19 (2001)). In these methods, a metal layer or a metal oxide layer having a low concentration of oxygen is deposited between a high dielectric metal oxide film and a silicon substrate, thereby making the metal layer or the like absorb oxygen diffused from the high dielectric metal oxide film side to the silicon substrate side. In this manner, oxidation of a silicon substrate is suppressed.

In the process step of depositing a high dielectric constant film, the above-described metal film or the like is useful as an oxygen absorption layer. However, if the metal film or the like is not sufficiently oxidized at the end of the deposition of the high dielectric constant film, oxygen deficiencies will occur in a metal oxide film formed by oxidizing the metal film or the like. With such oxygen deficiencies existing in the metal oxide film, dangling bonds of metal atoms are created, resulting in increased leakage current in a capacitor structure, or causing difficulties in adjustment of the flat band voltage or the threshold voltage thereof. Therefore, when a metal film or the like is used as an oxygen absorption layer, the thickness of the metal film or the like is required to be set so that oxidation of the silicon substrate is suppressed and no non-oxidized metal portion is left at the end of the deposition of the high dielectric constant film. That is to say, strict conditions are required for the thickness of the metal film or the like as an oxygen absorption layer.

When some other technique than sputtering is used in forming a high dielectric gate insulating film, there also arises a problem of reduction in the capacitance value of a gate insulating film due to oxidation of a silicon substrate. For example, assume that a high dielectric metal oxide film is deposited by CVD. Although it is also needed to suppress oxidation of a silicon substrate, a metal oxide film is, in general, deposited in an oxidation atmosphere and thus oxidation of a silicon substrate can not be avoided. When a metal oxide film is deposited by CVD, the amount of active oxygen or the like to be generated is smaller than that when sputtering is used, and thus the amount of oxidized part of the silicon substrate is slightly reduced. However, there is still a problem of reduction in the capacitance value thereof.

As has been described, in a deposition technique such as sputtering in which a high dielectric constant film is deposited while a silicon substrate is exposed to an oxygen atmosphere, it is very difficult to prevent oxidation of the silicon substrate. This is an essential problem in the deposition of a metal oxide film.

SUMMARY OF THE INVENTION

In view of the above-described problem, an object of the present invention is to suppress, in forming a high dielectric gate insulating film on a silicon substrate, the occurrence of oxygen deficiencies in the gate insulating film while preventing oxidation of the silicon substrate.

In order to achieve the object, a semiconductor device according to the present invention includes: a gate insulating film having a multilayer structure including a zirconium oxide film and a high dielectric constant film which is formed of an oxide of a metal other than zirconium and stacked on the zirconium oxide film.

More specifically, an inventive semiconductor device is characterized by comprising: a gate insulating film having a multilayer structure in which a first high dielectric constant film formed of an oxide of a first metal having relatively high oxygen absorption properties and a second dielectric film formed of an oxide of a second metal having a relatively low oxygen absorption properties on the first dielectric film.

A method for fabricating a semiconductor device of the present invention includes the steps of: depositing a zirconium metal film on a silicon region; depositing a high dielectric constant film of an oxide of a metal other than zirconium on the zirconium metal film; and forming a conductive film on the high dielectric constant film and then patterning the conductive film, thereby forming an electrode.

More specifically, an inventive method for fabricating a semiconductor device is characterized by including the steps of depositing a metal film formed of a first metal having relatively high oxygen absorption on a silicon region; depositing a high dielectric constant film formed of an oxide of a second metal having relatively low oxygen absorption properties on the metal film; and forming a conductive film on the high dielectric constant film and then patterning the conductive film, thereby forming an electrode.

According to the present invention, a zirconium metal film having high oxidation absorption properties is deposited before forming a high dielectric constant film (e.g., a hafnium oxide film) on a silicon region such as a silicon substrate. In this case, the zirconium metal film interposed between the silicon region and the high dielectric constant film serves as an oxygen absorption layer in the process step of depositing a high dielectric constant film by sputtering or CVD in an oxygen atmosphere, or in the process step of performing thermal treatment after the high dielectric constant film has been formed. More specifically, even if an oxidation species such as oxygen is introduced into the high dielectric constant film due to the deposition of the high dielectric constant film or the thermal treatment therefor, oxygen or the like diffused from the high dielectric constant film side to the silicon substrate side is absorbed by the zirconium metal film. Thus, a zirconium oxide film is formed. Or silicon contained in the silicon substrate and zirconium contained in the zirconium metal film are interdiffused and at the same time oxidized, so that a zirconium silicate layer is formed at the interface between the silicon substrate and the zirconium oxide film. Thus, the oxidation species generated during the process step of depositing a high dielectric constant film or the like is consumed for oxidation of the zirconium metal film, i.e., for formation of the zirconium oxide film or the zirconium silicate layer. Therefore, the silicon substrate itself is hardly oxidized. As a result, in the gate insulating film having a multilayer structure including at least the zirconium oxide film and the high dielectric constant film formed of an oxide of a metal other than zirconium, reduction in the capacitance value can be suppressed.

According to the present invention, since the zirconium metal has higher oxygen absorption properties than that of another metal forming the high dielectric constant film (e.g., a hafnium metal), oxidation of the silicon substrate can be suppressed more than in the case where a hafnium metal film or the like is deposited instead of the zirconium metal film before the high dielectric constant film has been deposited. As a result, the capacitance value of the gate insulating film is increased, thus reducing the equivalent silicon oxide thickness of the gate insulating film.

Furthermore, according to the present invention, since the radius of zirconium atoms is smaller than that of atoms of another metal (e.g., hafnium) forming the high dielectric constant film, zirconium atoms can be easily diffused in the high dielectric constant film (e.g., a hafnium oxide film). In this case, zirconium atoms diffused in the high dielectric oxide film such as a hafnium oxide film compensate defects in the high dielectric constant film (e.g., dangling bonds in the high dielectric constant film are terminated). As a result, leakage current density in the high dielectric constant film can be reduced.

As has been described, according to the present invention, it is possible to suppress, in forming a high dielectric gate insulating film using, e.g., sputtering or CVD, the occurrence of oxygen deficiencies in the gate insulating film while preventing oxidation of a silicon substrate. Accordingly, a high dielectric gate insulating film having a small equivalent silicon oxide thickness and a small leakage current can be achieved.

DESCRIPTION OF THE PREFERRED EMBODIMENTS

Hereinafter, a semiconductor device according to an embodiment of the present invention and a method for fabricating the same will be described with reference to the accompanying drawings.

FIGS. 1A through 1D, FIGS. 2A through 2C, and FIGS. 3A and 3B are cross-sectional views for illustrating respective process steps for fabricating a semiconductor device according to this embodiment.

Figure 1A:
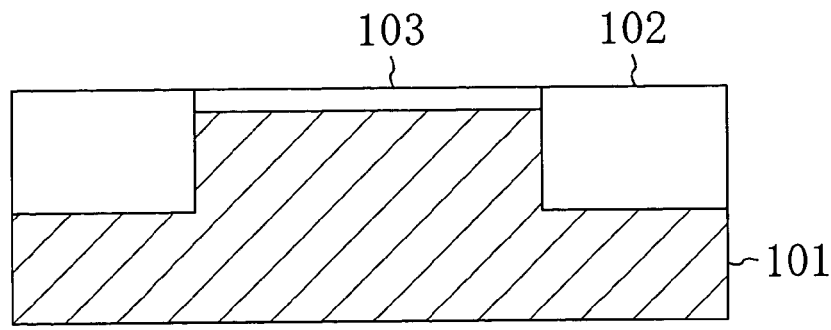
FIGS. 1A through 1D are cross-sectional views for illustrating respective process steps for fabricating a semiconductor device according to an embodiment of the present invention.

First, as shown in FIG. 1A, an isolation insulating film 102 having, e.g., an STI (shallow trench isolation) structure is formed in a silicon substrate 101 to separate an active region from a non-active region. In this case, after the isolation insulating film 102 has been formed, a natural oxide film 103 is formed on the surface of the active region.

Figure 1B:
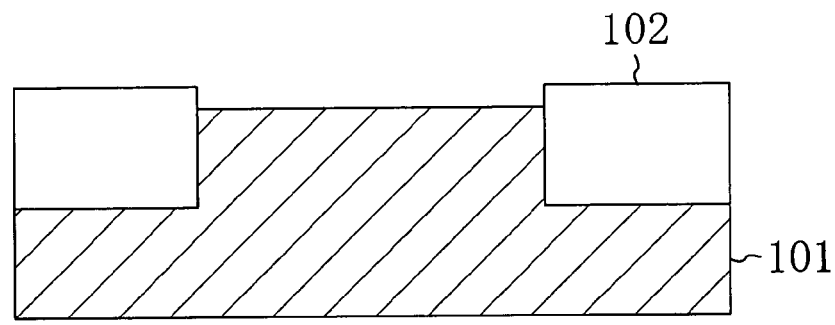

Next, as shown in FIG. 1B, the natural oxide film 103 is removed by etching using, e.g., diluted fluoric acid (HF: $H_2O$ (volume)=1:200) so that part of the surface of the silicon substrate 101 located in the active region is exposed. Thereafter, the silicon substrate 101 is rinsed with pure water and dried by nitrogen blow or the like in this order. Thus, a clean and hydrogen terminated silicon surface can be obtained. Note that in order to dry the silicon substrate 101, a technique in which pure water is replaced with isopropyl alcohol and then a substrate is dried at a low pressure may be used instead of nitrogen blow.

Figure 1C:
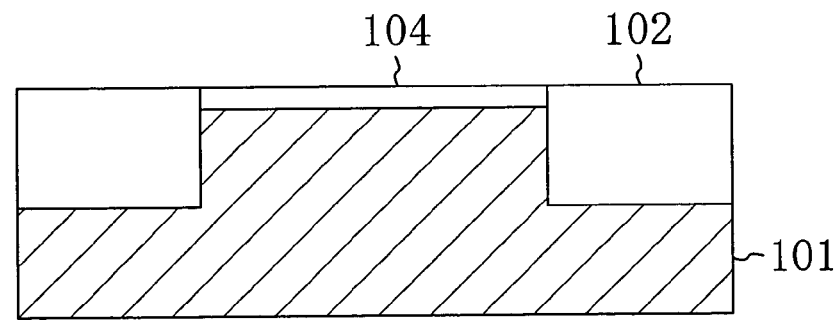

Next, as shown in FIG. 1C, rapid thermal treatment is performed, e.g., in an ammonia atmosphere or an ammonia plasma atmosphere to nitride the silicon substrate 101. As a result, a silicon nitride film 104 is formed. The silicon nitride film 104 has the function of suppressing the reaction between the silicon substrate 101 and a film to be deposited on the silicon substrate 101 in the subsequent process step. Thus, the formation of a silicon oxide film on the surface of the silicon substrate 101 can be prevented.

Note that in this embodiment, the silicon nitride film 104 is formed so as to have a thickness of 1 nm or less. More specifically, rapid thermal treatment for forming the silicon nitride film 104 is performed at a temperature of 600° C. for about 30 seconds at a pressure of $1 \times 10^5$ Pa. In this embodiment, rapid thermal treatment is performed to form the silicon nitride film 104. However, thermal treatment using a furnace, or plasma nitriding may be performed instead. Furthermore, although the silicon nitride film 104 is formed in this embodiment, a silicon oxide nitride film may be formed instead of the silicon nitride film 104.

Figure 1D:
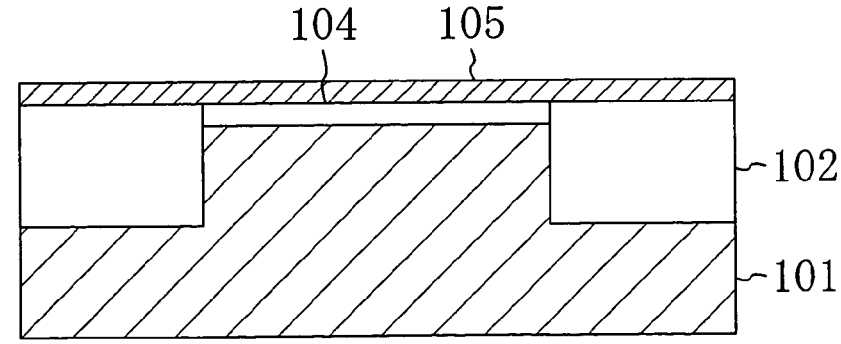

Next, as shown in FIG. 1D, a zirconium metal film 105 is formed using, e.g., sputtering or the like on the silicon substrate 101 on which the silicon nitride film 104 is formed. Note that in this embodiment, the zirconium metal film 105 is formed so as to have a thickness of 3 nm or less (preferably not less than 0.5 nm and not more than 1.5 nm). As for sputtering for forming the zirconium metal film 105, more specifically, DC sputtering is performed using metal zirconium as a sputtering target under the condition where a chamber pressure is about 0.4 kPa, sputtering power is about 100 W, and an argon flow rate is about 20 ml/min. Moreover, although DC sputtering is used in this embodiment, magnetron sputtering and other sputtering processes may be used instead of the DC sputtering.

Figure 2A:
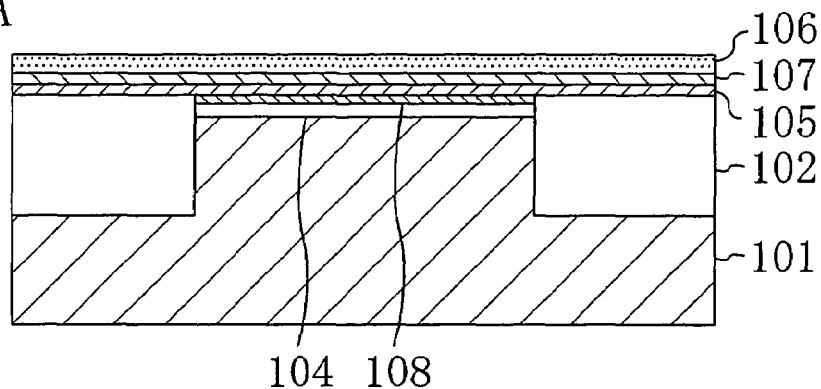
FIGS. 2A through 2C are cross-sectional views for illustrating respective process steps for fabricating a semiconductor device according to the embodiment of the present invention.

Next, as shown in FIG. 2A, a hafnium oxide film 106 is formed on the zirconium oxide film 105 using, e.g., sputtering. Note that in this embodiment, the hafnium oxide film 106 is formed so as to have a thickness of 10 nm or less (preferably, not less than 1.0 nm and not more than 5.0 nm). More specifically, as for sputtering for forming the hafnium oxide film 106, reactive DC sputtering is performed using metal hafnium as a sputtering target under the condition where a chamber pressure is about 0.4 kPa, sputtering power is about 200 W, an argon flow rate is about 10 ml/min and an oxygen flow rate is about 10 ml/min. As another option, sputtering may be performed using a hafnium oxide as a sputtering target in an argon atmosphere to deposit the hafnium oxide film 106. Furthermore, instead of DC sputtering, magnetron sputtering and other sputtering processes may be used.

Oxygen introduced into the hafnium oxide film 106 during the deposition thereof is diffused therein and finally reaches to the zirconium metal film 105. In this case, as shown in FIG. 2A, part (an upper portion) of the zirconium metal film 105 is oxidized to form a zirconium oxide film 107. Moreover, silicon contained in the silicon nitride film 104 and zirconium contained in the zirconium metal film 105 are inter-diffused and at the same time oxidized, thereby forming a zirconium silicate film 108.

Figure 2B:
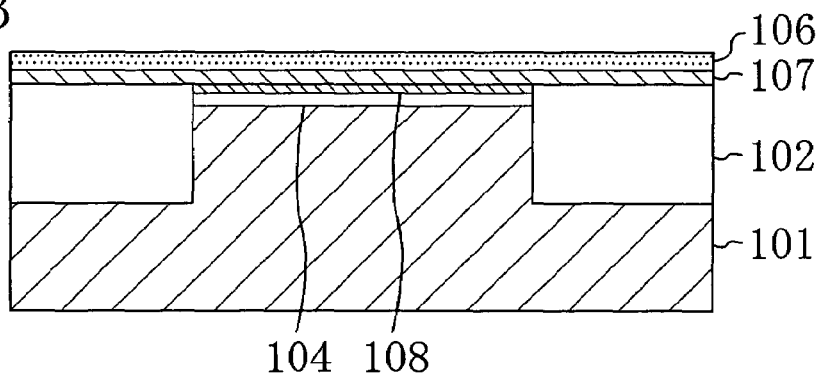

Next, as shown in FIG. 2B, the hafnium oxide film 106, the zirconium oxide film 107 and the zirconium silicate film 108 are subjected to thermal treatment, e.g., in a nitrogen atmosphere. Thus, an impurity (carbon, hydrogen or the like) is eliminated from each of the films by heating and at the same time each of the films is densified. The densifying thermal treatment is performed at a temperature of 400° C. or more for 30 seconds or more. The reason why the thermal treatment is performed at 400° C. or more is that the desorption temperature of the impurity is 400° C. or more.

Note that when densifying thermal treatment is performed, oxygen contained in the hafnium oxide film 106 or the like is diffused toward the silicon substrate 101. However, in this embodiment, the zirconium metal film 105 is provided under the hafnium oxide film 106 and thus diffusion of oxygen does not reach to the silicon substrate 101. However, oxygen is increasingly diffused to the zirconium metal film 105 during the deposition of the hafnium oxide film 106 and the densifying thermal treatment. Thus, as shown in FIG. 2B, the zirconium metal film 105 has been completely oxidized at the end of the densifying thermal treatment and the whole oxidized zirconium metal film 105 has become a zirconium oxide film 107. As a result, the high dielectric gate insulating film in the semiconductor device of this embodiment has a multilayer structure including the deposited hafnium oxide film 106, the zirconium oxide film 107 formed by oxidation and the zirconium silicate film 108 formed through inter-diffusion.

Figure 2C:
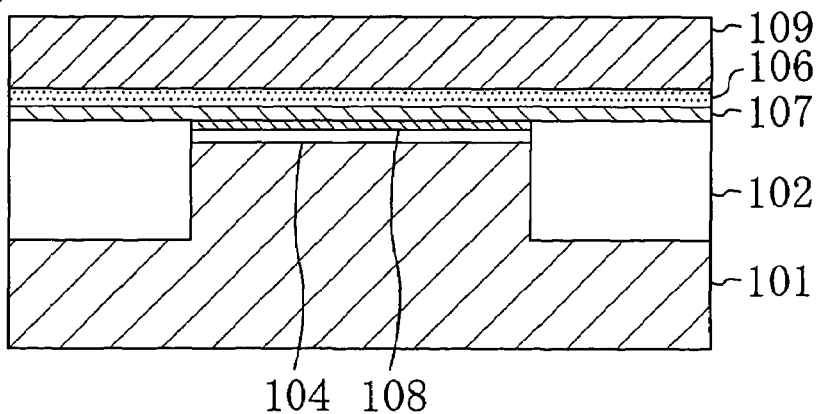

Next, as shown in FIG. 2C, a titanium nitride film 109 that is to be a gate electrode is deposited on the hafnium oxide film 106 by, e.g., CVD. Note that in this embodiment, the titanium nitride film 109 is formed so as to have a thickness of not less than 30 nm and not more than 100 nm. More specifically, the titanium nitride film 109 is deposited at a temperature of about 650° C. at a pressure of about 30 Pa, using titanium tetracholoride, ammonia or the like as source gasses. In this case, the flow rate of titanium tetracholoride is about 20 ml/min, the flow rate of ammonia is about 400 ml/min and the flow rate of a nitrogen gas as a carrier gas for titanium tetracholoride is about 50 ml/min.

Figure 3A:
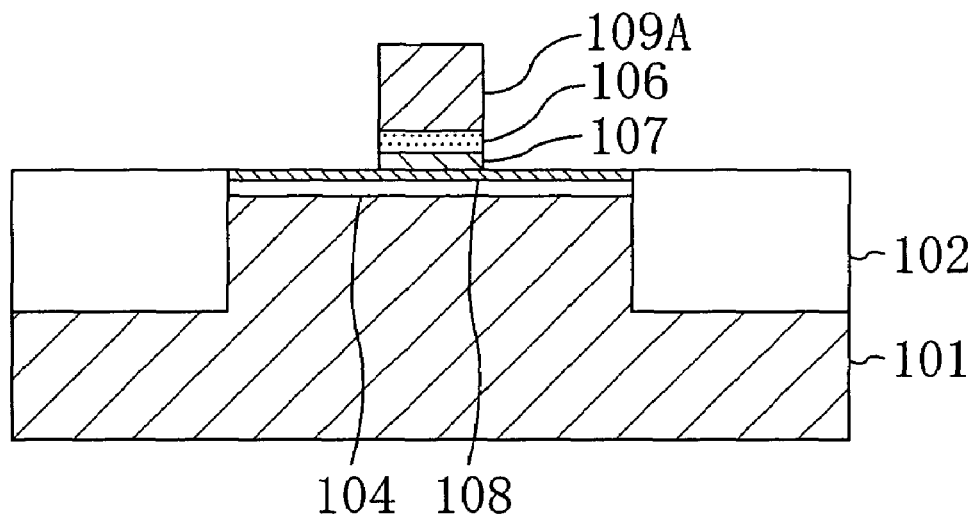
FIGS. 3A and 3B are cross-sectional views for illustrating respective process steps for fabricating a semiconductor device according to the embodiment of the present invention.

Next, as shown in FIG. 3A, the titanium nitride film 109 is patterned by a known lithography technique and a known dry etching technique, thereby forming a gate electrode 109A. In this manner, a gate capacitor structure is obtained. More specifically, in the semiconductor device of this embodiment, the gate electrode 109A is formed on the silicon substrate 101 on which the silicon nitride film 104 is formed with the high dielectric gate insulating film having a multilayer structure including the zirconium silicate film 108, the zirconium oxide film 107 and the hafnium oxide film 106 interposed therebetween.

Figure 3B:
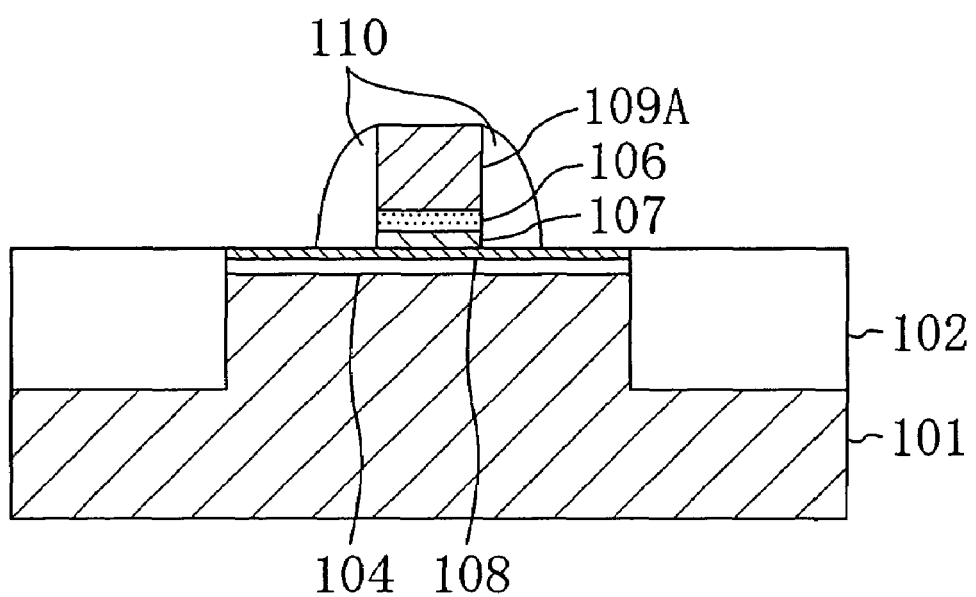

Finally, as shown in FIG. 3B, by following known process steps for forming an MIS type transistor, an MIS type transistor including a high dielectric gate insulating film is completed. Specifically, a low concentration impurity diffusion layer (not shown) is formed on the silicon substrate 101, a sidewall 110 having insulation properties is formed on each of the side faces of the gate electrode 109A, and then high concentration impurity diffusion layers (not shown) that are to be source and drain regions, respectively, are formed in the silicon substrate 101 so that an MIS type transistor having a high dielectric gate insulating film is completed.

In this embodiment, the zirconium metal film 105 is deposited beforehand, before the hafnium oxide film 106 that is to be a high dielectric gate insulating film is deposited on the silicon substrate 101. Thus, when the hafnium oxide film 106 is deposited or when an oxidation species is supplied after the hafnium oxide film 106 has been deposited, oxygen diffused in the hafnium oxide film 106 or the like is consumed for oxidation of the zirconium metal film 105 before the diffused oxygen reaches the silicon substrate 101. Accordingly, the silicon substrate 101 is not oxidized and therefore reduction in the capacitance value of the capacitor structure can be prevented.

Moreover, in this embodiment, since zirconium metal has higher oxygen absorption properties than hafnium metal, oxidation of the silicon substrate 101 can be suppressed more than in the case where a hafnium metal film is deposited instead of the zirconium metal film 105 before the hafnium oxide film 106 is deposited. As a result, the degree of reduction in the capacitance value can be lowered.

Moreover, in this embodiment, since zirconium metal has high oxygen absorption properties, termination of metal dangling bonds by oxygen in the zirconium oxide film 107 (or the zirconium silicate film 108) can be facilitated. Thus, the generation of charge traps in the film can be suppressed, reducing in leakage current in the high dielectric gate insulating film.

Moreover, in this embodiment, since the radius of zirconium metal atoms is smaller than that of hafnium metal atoms, zirconium atoms can be easily diffused in the hafnium oxide film 106. In this case, zirconium atoms diffused in the hafnium oxide film 106 compensate defects in the hafnium oxide film 106. More specifically, as a result of the termination of dangling bonds in the hafnium oxide film 106 by zirconium atoms, charge traps are repaired. Accordingly, leakage current in the high dielectric gate insulating film can be reduced.

Furthermore, in this embodiment, the hafnium oxide film 106 and the zirconium oxide film 107 include different elements belonging to the same group and have the same crystal structure. Thus, even if the hafnium oxide film 106 is stacked on the zirconium oxide film 107, their film qualities are not deteriorated.

For the above-described reasons, in this embodiment, when an high dielectric gate insulating film is formed using, e.g., sputtering or CVD, it is possible to suppress the occurrence of oxygen deficiencies in the gate insulating film while preventing oxidation of the silicon substrate 101. Therefore, a high dielectric gate insulating film having a small equivalent silicon oxide thickness and a small leakage current can be achieved.

Note that in this embodiment, the zirconium metal film 105 is deposited using sputtering. However, CVD may be used instead of sputtering. In the case where CVD is used for the deposition, the zirconium metal film 105 may be deposited by thermal CVD or the like using, e.g., a source gas which contains tetrakis(diethylamino)zirconium but does not contain oxygen under the condition where a chamber pressure is about 30 Pa and a deposition temperature is about 400° C.

Moreover, in this embodiment, a zirconium nitride film (or a nitrogen containing zirconium metal film) may be formed instead of the zirconium metal film 105. In the case where a zirconium nitride film is deposited by sputtering, reactive sputtering may be performed in a mixed atmosphere of argon and nitrogen to deposit a zirconium nitride film. In the case where a zirconium nitride film is deposited by CVD, a zirconium nitride film may be grown using, e.g., a source gas which contains tetrakis(diethylamino)zirconium but does not contain oxygen. Alternatively, after a zirconium metal film has been deposited, thermal treatment is performed to the zirconium metal film in a nitrogen atmosphere or an ammonia atmosphere so as to deposit a zirconium nitride film thereon. Note that in either case where the zirconium metal film 105 is formed or where a zirconium nitride film is formed, it is important in the present invention that the zirconium metal film 105 or the zirconium nitride film does not substantially contain oxygen.

Moreover, in this embodiment, the hafnium oxide film 106 is deposited by sputtering. However, CVD may be used instead of sputtering. In the case where the hafnium oxide film 106 is deposited by CVD, an organic metal material containing hafnium (e.g., tetrakis(tertiary-butyl)hafnium, tetrakis-1,1,dimethyl-2propoxyhafnium, tetrakis(diethylamino)hafnium or tetrakis(dimethylamino)hafnium, or a mixture including any one of these), a halogenide material containing hafnium, or the like may be used. More specifically, the hafnium oxide film 106 can be deposited by thermal CVD using such a hafnium containing source gas as ones listed above under the condition where a chamber pressure is about 30 Pa and a deposition temperature is about 400° C.

Moreover, in this embodiment, some other high dielectric constant film such as a hafnium silicate film or a hafnium aluminate film may be formed instead of the hafnium oxide film 106. Alternatively, the hafnium oxide film 106 or a high dielectric constant film as a substitute therefor may contain nitrogen.

Moreover, in this embodiment, the zirconium metal film 105 and the hafnium oxide film 106 may be grown continuously in a single chamber. Alternatively, after the zirconium metal film 105 has been grown in a chamber, the chamber may be opened to the air, a wafer (i.e., the silicon substrate 101) may be transferred to another chamber, and then the hafnium oxide film 106 may be grown in said another chamber. In this case, the wafer may be transferred from one chamber to another under vacuum.

Moreover, in this embodiment, rapid thermal treatment is performed as densifying thermal treatment to the hafnium oxide film 106 (see FIG. 2B). However, thermal treatment using a furnace may be performed instead of rapid thermal treatment. Moreover, remote plasma oxidation may be used in densifying thermal treatment. As another option, densifying thermal treatment may be performed in an atmosphere containing active oxygen obtained by irradiating ultraviolet rays to an oxygen gas, or the like.

Moreover, in this embodiment, densifying thermal treatment is performed to the hafnium oxide film 106 or the like in a nitrogen atmosphere. However, the present invention is not limited thereto. Densifying thermal treatment may be performed, e.g., in an atmosphere containing at least one of nitrogen, oxygen, nitrogen oxide, argon, and hydrogen. As another option, densifying thermal treatment may be performed in a plasma atmosphere composed of a gas containing at least one of oxygen, ozone, and nitrogen oxide. As still another option, densifying thermal treatment may be performed in an atmosphere containing at least one of oxygen, ozone, and nitrogen oxide to which ultraviolet rays have been irradiated.

Moreover, in this embodiment, after the hafnium oxide film 106 has been deposited, densifying thermal treatment is performed (see FIG. 2B). However, instead of this, densifying thermal treatment may be performed after the titanium nitride film 109 has been deposited. In this case, the hafnium oxide film 106 and the titanium nitride film 109 may be grown continuously in a single chamber. Alternatively, after the hafnium oxide film 106 has been grown in a chamber, the chamber may be opened to the air, a wafer (i.e., the silicon substrate 101) may be transferred to another chamber, and then the titanium nitride film 109 may be grown in said another chamber. In this case, the wafer may be transferred from one chamber to another under vacuum.

Moreover, in this embodiment, the titanium nitride film 109 is deposited by CVD. However, sputtering may be used instead of CVD. Furthermore, a conductive film made of some other material may be deposited instead of the titanium nitride film 109.

Figure 4A:
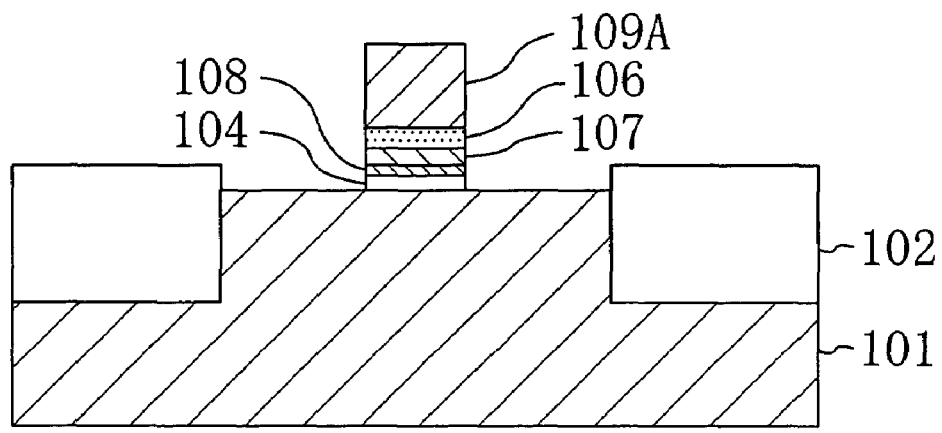
FIGS. 4A and 4B are cross-sectional views for illustrating respective process steps for fabricating a semiconductor device according to the embodiment of the present invention.
Figure 4B:
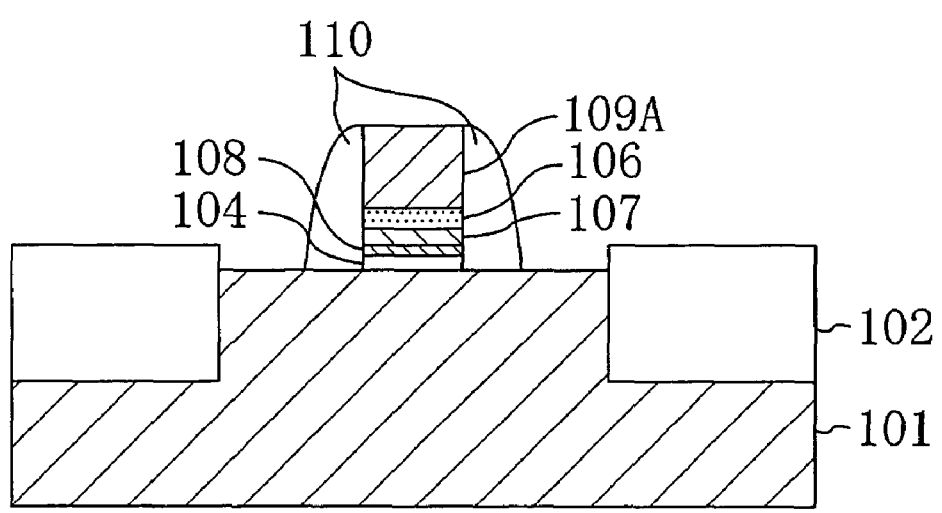

Moreover, in this embodiment, when the gate electrode 109A (see FIG. 3A) is formed by patterning, the hafnium oxide film 106 and the zirconium oxide film 107 are patterned, and then the sidewall 110 is formed so as to cover the side faces of the gate electrode 109A as well as the side faces of the hafnium oxide film 106 and the zirconium oxide film 107 which have been patterned (see FIG. 3B). However, instead of this, when the gate electrode 109A is formed by patterning, the hafnium oxide film 106, the zirconium oxide film 107, the zirconium silicate film 108, and the silicon nitride film 104 may be patterned as shown in FIG. 4A, and then the sidewall 110 may be formed so as to cover the side faces of the gate electrode 109A as well as the side faces of the hafnium oxide film 106, the zirconium oxide film 107, the zirconium silicate film 108, and the silicon nitride film 104 which have been patterned, as shown in FIG. 4B.

What is claimed is:

1. A semiconductor device comprising:
a gate insulating film having a multilayer structure including a zirconium oxide film and a high dielectric constant film which is a hafnium oxide film or a hafnium aluminate film and which is formed on the zirconium oxide film,
wherein a silicon nitride film is formed under the zirconium oxide film,
the high dielectric constant film contains nitrogen,
an interface layer between the silicon nitride film and the zirconium oxide film is formed of a zirconium silicate film.

2. The semiconductor device of claim 1, wherein the silicon nitride film has a thickness of 1 nm or less.

3. The semiconductor device of claim 1, further comprising a gate electrode on the gate insulating film.

4. The semiconductor device of claim 3, wherein the gate electrode is a titanium nitride film.

5. The semiconductor device of claim 3, wherein the gate electrode has a thickness of not less than 30 nm and not more than 100 nm.

6. The semiconductor device of claim 3, further comprising an insulating sidewall spacer formed to cover the side faces of the gate electrode.

7. The semiconductor device of claim 1, wherein the high dielectric constant film directly contacts the top surface of the zirconium oxide film.

* * * * *